United States Patent [19]

Lazzari

[11] 4,310,897

[45] Jan. 12, 1982

[54] PORTABLE CARD INCORPORATING MAGNETIC BUBBLE ELEMENTS

[75] Inventor: Jean-Pierre Lazzari, Montfort l'Amaury, France

[73] Assignee: Compagnie Internationale pour l'Informatique Cii Honeywell Bull (Societe Anonyme), Paris, France

[21] Appl. No.: 90,248

[22] Filed: Nov. 1, 1979

[30] Foreign Application Priority Data

Dec. 21, 1978 [FR] France .................. 78 36048

[51] Int. Cl.³ .................. G11C 7/00; G11C 19/08
[52] U.S. Cl. .................. 365/1; 365/2
[58] Field of Search .................. 235/493; 365/1, 2

[56] References Cited

U.S. PATENT DOCUMENTS

| | | | |
|---|---|---|---|
| 3,786,445 | 1/1974 | Ho et al. | 340/174 TF |
| 3,864,671 | 2/1975 | Myer | 365/2 |
| 4,156,934 | 5/1979 | Burford et al. | 365/2 |

Primary Examiner—George G. Stellar
Attorney, Agent, or Firm—Kerkam, Stowell, Kondracki & Clarke

[57] ABSTRACT

A portable credit or identity card or the like incorporates magnetic bubble elements. The bubble elements comprise a layer of magnetic material capable of containing magnetic bubbles and which is provided with a propagation track and a means for detecting the bubbles. Two flat permanent magnets arranged on either side of the magnetic layer generate a magnetic polarizing field perpendicular to the layer. The bubble element forms the memory which contains the identity code for the card.

11 Claims, 5 Drawing Figures

PORTABLE CARD INCORPORATING MAGNETIC BUBBLE ELEMENTS

CROSS REFERENCE TO RELATED APPLICATION

A data processing system employing portable cards incorporating magnetic bubble elements is the subject matter of commonly-assigned, co-pending application Ser. No. 090,275, filed Nov. 1, 1979, by Jean-Pierre Lazzari, entitled DATA PROCESSING SYSTEM EMPLOYING PORTABLE CARDS AND OPERATING STATIONS MAKING USE OF MAGNETIC BUBBLE ELEMENTS. The subject matter of this application is hereby incorporated by reference.

BACKGROUND OF THE INVENTION

FIELD OF THE INVENTION

The present invention relates to a portable card for use as a data carrying medium. The card in question may, for example, be a credit card for use in the business and banking field, or an identity card as used in control or security systems for example.

Data carriers may assume widely varying forms such as for example, a card proper, a ring, a key, a ticket, a slip, etc. For the sake of simplicity the term "card", which in any case is the applicable term in the majority of cases, will be used herein although it should be appreciated that this does not imply any limitation of the invention.

DESCRIPTION OF THE PRIOR ART

Systems employing portable cards are becoming increasingly popular. The systems in question include data processing equipment which in use require a plurality of individual cards and at least one common or shared operating station which is generally positioned at a fixed location. Each card comprises, in essence, means for processing data and at least one memory in which is recorded a confidential identity code known only to the rightful holder of the card. The operating station includes means for processing data from the card, together with manual control means usually formed by a keyboard. With such a system, the holder of a card is able to perform certain monetary or accounting operations of which the most frequent of which are the issuing of bank notes and the keeping of an account. For this, it is merely necessary for the holder to insert his card into an operating station and then for him to identify the desired operations using the keyboard. These operations can only take place if the user of the card is able to supply the confidential code corresponding to the card being used. This preliminary checking or identification operation enables frauds to be avoided in the event the card has been lost or stolen.

A system of this kind therefore needs to incorporate a comparator member capable of comparing the code stored in the card with the code transmitted from outside by the person using the card. This comparator member could be situated in the operating station, but it is preferable for it to be arranged in the card to enable it to be compared with the code fed in, so as to avoid the necessity of transferring the identity code to the exterior which would diminish the security of the system against fraudulent use.

Portable cards are known in which the data-carrying medium is formed by one or more magnetic tracks. Such cards may, for example, be so-called "blue cards". In these cards, items of data are represented by the magnetizations exhibited by a plurality of magnetic zones. Generally, the items of data are read, and possible fresh items of data are written, as the data carrying medium passes in front of magnetic read and write heads. Card of this kind, are described, for example, in French Pat. No. 1,114,901 entitled "Accounting Machines" granted on Dec. 26, 1955.

Cards employing magnetic tracks have many disadvantages. First of all, they have only a small storage capacity. Secondly, there is a danger of losing the data recorded, in particular if they are acted on by stray magnetic fields or excessive heat. Finally, and most important, they do not protect against fraudulent use since it is possible for an expert to detect the confidential code contained in the magnetic tract and to make illicit use of the card for his own advantage.

Attempts have therefore been made to produce portable cards employing a non-magnetic data carrying medium which offer greater storage capacity and which make it more difficult for the secret of the code to be broken. To this end, "electronic" cards have been proposed. These are cards in which the code is stored by means of electronic semiconductor circuits. Such cards may use programmable read only memories (PROM). French Pat. No. 2,139,258, entitled "Data Cards" granted Dec. 11, 1972 corresponding to U.S. Pat. No. 3,702,464, discloses a card incorporating a memory formed by a matrix of semiconductor diodes. French Pat. No. 2,180,349 entitled "Device for identifying a plurality of Persons Individually", granted Oct. 29, 1973, discloses a card employing a memory produced from integrated circuits of the metal oxide semiconductor (MOS) type.

Reference may also be made to mre recent French patent applications and in particular to application No. 74 10191 entitled "Method and Arrangement for Electronic Control", filed Mar. 25, 1974, and application No. 75 14807 entitled "System for the Confidential and Personalized Transfer and Storage of Data Using Independent, Portable Electronic Articles". Both these applications disclose cards in which the data storage medium is formed by a monolithic semiconductor circuit produced by integrated circuit techniques.

As stated in U.S. patent application No. 75 14807, it appeared advantageous for magnetic carrier mediums to be replaced by electronic semiconductor devices because when compared with other read-only memories such as magnetic cassettes, floppy discs, etc. monolithic read-only memories of the semiconductor type are more reliable, smaller in size, require no mechanical movement for reading or writing, are insensitive to magnetic fields, and are difficult to counterfeit and frandulently use, i.e. a potential fraudelent user has to employ a complicated electronic means to alter the state of a read only memory of the semiconductor type:

Although electronic devices of this nature have proved satisfactory in certain respects, they still suffer from disadvantages. For example, the detection of the confidential identity code, although difficult, is by no means impossible for an electronics specialist. Also, semiconductor memories which are "read only" memories, only permit reading operations.

SUMMARY OF THE INVENTION

The object of the present invention is to provide a type of portable card which overcomes the latter disadvantages, which is virtually detection proof, contains a "read/write" memory, and is extremely versatile.

The invention achieves these objects by making use of magnetic bubble elements. so that this feature of the invention may be properly understood, it will be useful to review briefly the nature of elements of this kind.

In a monocrystalline magnetic layer exhibiting uniaxial magnetic anisotropy in a direction perpendicular to the plane of the layer (what are generally used are orthoferrites or certain garnets), it is possible to produce generally cylindrical magnetic domains in which the sense of the magnetic induction is opposite from that in the remainder of the layer. These domains, which are conventionally termed "bubbles", can be shifted in the layer. For this purpose, the layer is covered with a network of magnetizable metal strips forming a guide track, and is subjected to a rotary magnetic field applied in the plane of the layer.

The magnetic bubbles can be shifted to a detecting member, but they may also be held stationary in the layer. To ensure that the bubbles remain stable with time, it is necessary to apply to the layer a steady magnetic field, termed a polarizing or stabilizing field, which field must be perpendicular to the layer.

Logic circuits, comparators, memories, etc. can be produced in this. U.S. pat. No. 2,919,432, discloses a memory of this type.

The use of magnetic bubble elements of a magnetic nature in a portable card goes against and is contrary to the preconceptions of the prior art, as evidenced, for example, by the comment noted above in French application No. 75 14807 suggesting an electronic solution to the problem. Contrary to all expectations, the use of magnetic bubble elements endows cards with a performance far superior to that of electronic cards, in particular as regards the maintaining of the secrecy of the identity code.

To be more exact, the present invention comprises a portable card incorporating data processing means, which is characterized in that at least a part of the said means is formed by magnetic bubble elements.

Preferably, at least one of the magnetic bubble elements is a memory.

Also preferably, the magnetic bubble elements together comprise a layer of magnetic material capable of containing magnetic bubbles, this layer being provided with a propagation part and a means for detecting the bubbles, and means for creating a magnetic polarizing field perpendicular to the said layer.

BRIEF DESCRIPTION OF THE DRAWINGS

The features and advantages of the invention will be more readily apparent from the following description of embodiments which appear entirely by way of non-limiting illustration, taken in connection with the accompanying drawings in which.

DESCRIPTION OF THE PREFERRED EMBODIMENTS

Figure 1:
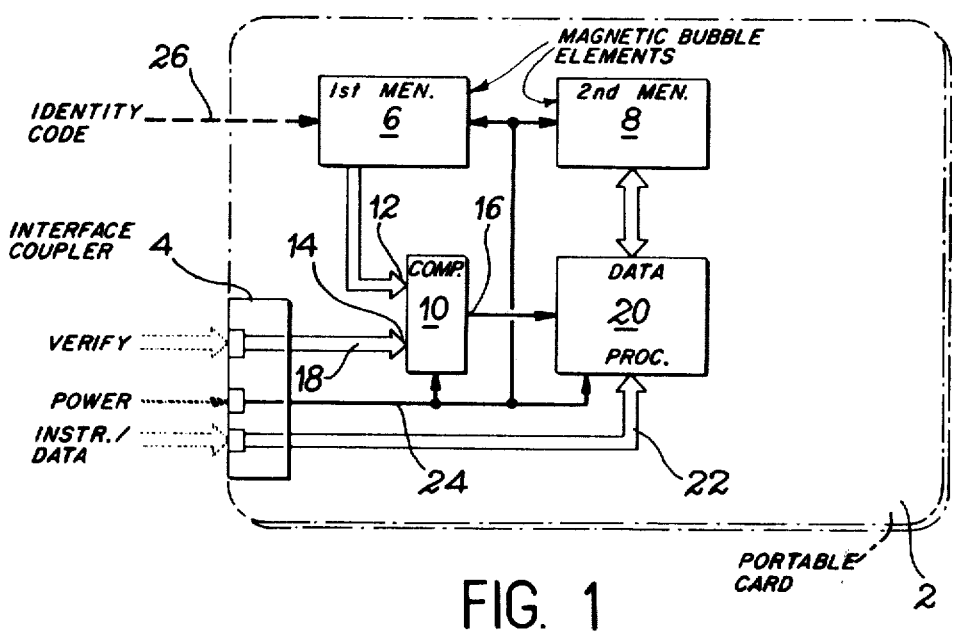
FIG. 1 is a block diagram of the means forming a portable card.

The block diagram shown in FIG. 1 applies to prior art portable cards as well as to cards incorporating the invention. The card comprises an insulating base 2 of rectangular shape on which are arranged an interface coupler 4, a first memory 6 whose function is to contain the confidential identity code of the card, a second memory 8 to store various other items of data, and a comparator 10 having two inputs 12 and 14 and an output 16. Input 12 of the comparator is connected to memory 6 and input 14 is connected to a bus 18 which runs to the interface coupler 4. Output 16 is connected to a data processing circuit 20 to which is connected a bus 22 which also runs to the interface coupler 4. Finally a connection 24 is provided for supplying power to the memories 6 and 8, the comparator 10 and circuit 20.

Figure 4:
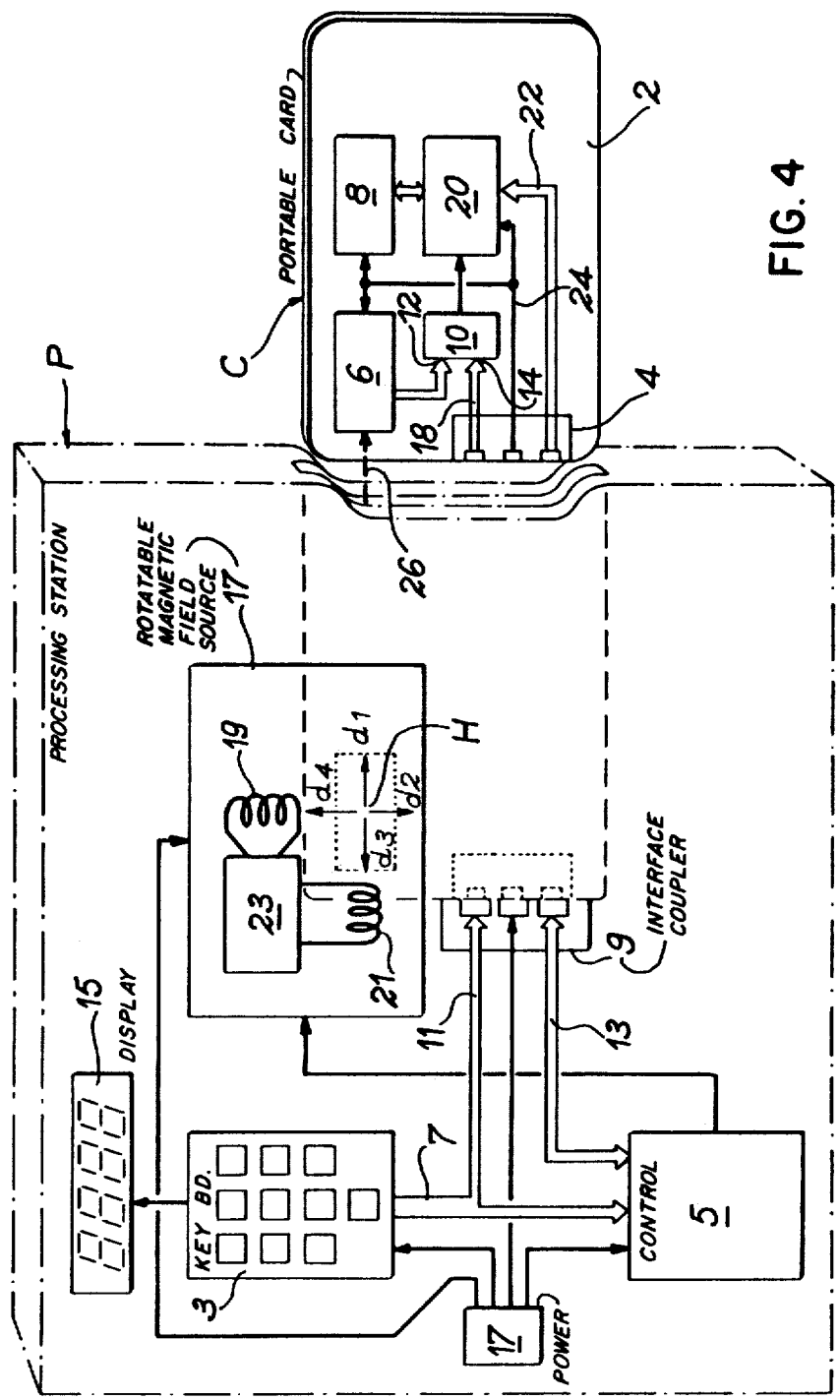
FIG. 4 is a general diagram of an operating station and a portable card according to the invention.

Referring to FIG. 4 there is illustrated an operating station P associated with portable card 2.

The operating station P comprises, in a known fashion, a controlling keyboard 3, an electronic control circuit 5 which is connected to the keyboard by a bus 7, an interface coupler 9 which is connected to the keyboard by a bus 11 and to the control circuit by a bus 13, an alphanumeric display device 15 which is associated with the keyboard 3, and a power supply 17 which is connected to the keyboard 3, the circuit 5 and the interface coupler 9. Each operating station may be adapted to accept a number of cards at the same time; however, only one entry station is depicted.

The system may also include means for automatic insertion and extraction of the card. These are well known and have therefore not been shown.

The manner in which this assembly operates is as follows. When the card is first prepared for use, an identity code is written in the memory 6 via a write connection 26 (shown in broken lines) which is then removed. The code thus becomes inaccessible from outside the card. To make use of this card, the holder inserts it into the processing station which is designed to be capable of performing certain operations, in particular monetary or accounting operations, but which must first of all receive the correct identity code from the user. The code is fed into the operating station, for example, by means of the keyboard. The code travels via bus 11, interface coupler 9 of the operating station, interface coupler 4 of the card, and bus 18 to input 14 of comparator 10 and is then conveyed into the portable card by the interface coupler 4 and the bus 18. The comparator 10 receives the code provided by the operator at its input 14 and the code recorded in the memory 6 at its input 12. If, and only if, the two codes are identical, comparator 10 emits from its output 16 an authorizing signal which is transmitted to the processing circuit 20. The latter is then able to process the instructions and data which it receives from bus 22. The auxiliary memory 8 is used to store the results of the operations performed.

A detailed description of the structure and operation of the circuits employed in such a card or system with which such a card is used will not be given here since they are familiar in those skilled in the art and have already been described at length in the documents cited above, which represent the prior art. Reference may also be made to applications Ser. Nos. 900,503

4,224,666; 905,483 4,271,482 and 912,855 4,215,421, assigned to the assignee of the present invention for further descriptions and illustrations of data processing systems employing data cards and designed to protect the secrecy of confidential data.

In accordance with the invention, at least part of the data processing means is formed by a magnetic bubble element. By way of example, FIG. 2 is a schematic view in exploded cross-section of a card in which the bubble element in question is the memory 6 of FIG. 1 responsible for holding the identity code.

In accordance with the invention, at least one means for processing data is incorporated in the portable card and comprises a magnetic bubble element. The processing means involved may include memories 6 and 8, comparator 10 and/or the processing circuit 20 for example. A means of setting up a rotatable magnetic field capable of moving the bubbles in such an element is arranged in the operation station P, where it is identified by reference character 17. The means in question comprises two windings 19 and 21 whose axes are mutually perpendicular and which are supplied with power by a current source 23. These two windings set up a rotating magnetic field H which assumes in succession the orientations which are represented by arrows $d_1$, $d_2$, $d_3$ and $d_4$. The relative position of the windings 19 and 21 in the fixed operating station with respect to the position of the bubble element on the card is such that the magnetic field H is applied to the bubble element when the card C is inserted into the station P. In the remaining description, it will be assumed by way of illustration that the bubble element is the memory 6 containing the identity code.

Figure 2:
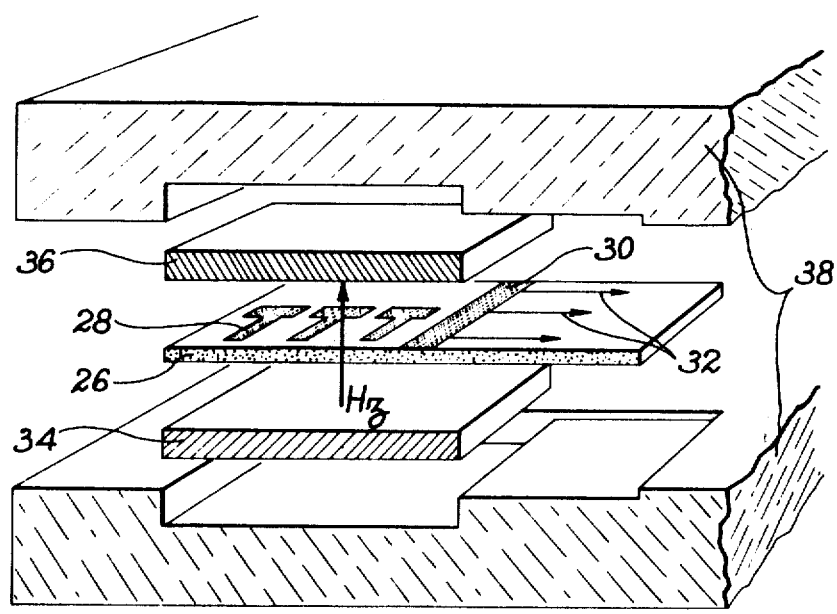
FIG. 2 is an exploded cross-sectional view of a portable card which is provided, in accordance with the invention, with bubble elements.

The data processing means shown in FIG. 2 comprises a layer 26 of a magnetic material such as, for example an orthoferrite or garnet, such as yttrium iron garnet, capable of containing magnetic bubbles. The layer 26 is covered with a propagation track 28. Means are also provided for generating, detecting and erasing magnetic bubbles. These means are indicated symbolically by a member 30 from which extend connections 32. The magnetic layer 26 is inserted between two flat magnets 34 and 36 which set up, perpendicularly to the plane of layer 26, a constant magnetic polarizing field Hz capable of ensuring that the bubbles remain stable in the layer 26. The complete assembly is encased in and possibly bonded to 37 and 39 which receive layer 26 and magnets 34, 36 to enable the card to be constructed in a flat package form and handled without any risk of the data being destroyed.

The data which is stored this way in the magnetic layer 26 is undetectable. In effect, the only means of showing up the magnetic domains or bubbles present in the layer would be to analyse this layer using a piece of apparatus capable of detecting the orientation of the magnetic induction, such as an apparatus making use of the Kerr effect. However, this analysis would entail first of all removing the two permanent magnets 34 and 36. Removal of the magnets would remove the polarizing field and thus destroy the bubbles.

Thus, any attempt at making a physical analysis of the layer 26 causes the data which it contains to be destroyed. This advantage is specific to bubble elements since, with electronic elements, it is always possible, using improved analyzing means, to determine their contents without destroying the information which is being sought.

A wide variety of means are available to use the bubble elements of the card according to the invention. To this end, reference may be made, for example, to French Pat. No. 71 31084 filed Aug. 20, 1971, certificate of addition No. 71 35367 filed on Sept. 28, 1971, corresponding to U.S. Pat. No. 3,792,451 French patent application No. 72 44640 filed Dec. 4, 1972, and finally French patent application No. 75 26029 filed Aug. 22, 1975.

Figure 3:
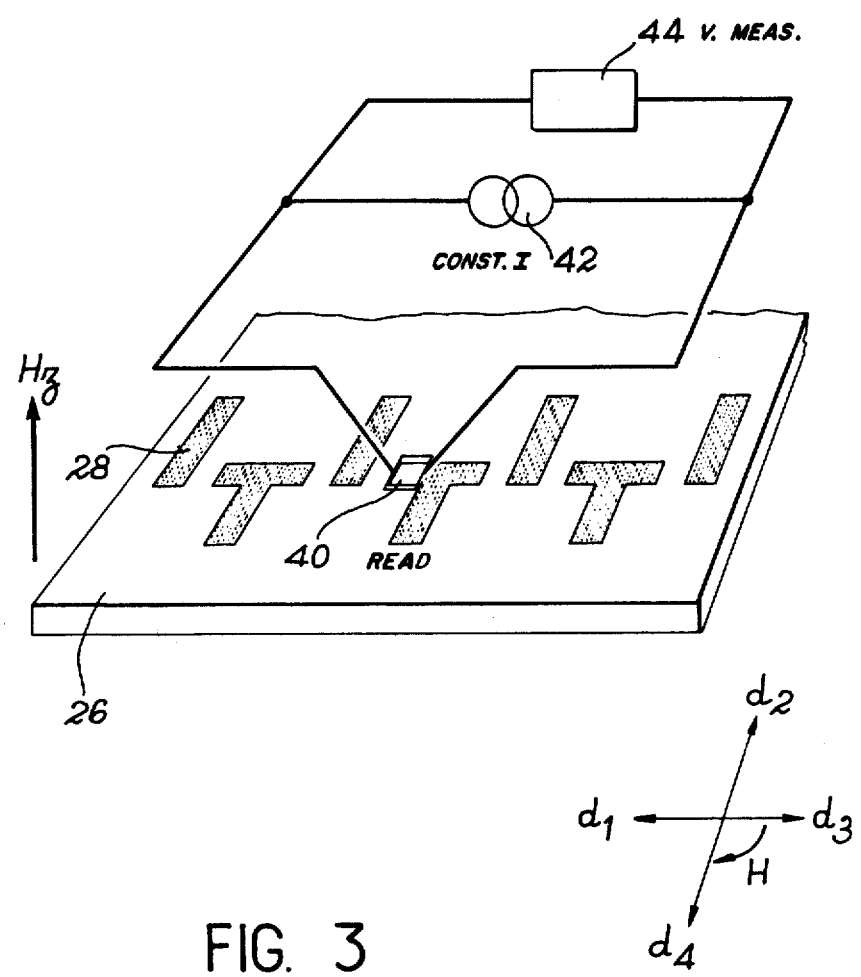
FIG. 3 shows an embodiment of means for propagating and detecting the magnetic bubbles.

Purely by way of illustration, FIG. 3 shows a memory provided with a propagation track 28 which is formed by a series of T-shaped and I-shaped electrodes, and by a reading member 40 which is arranged over the propagation track. Member 40 is of the magnetoresistive type, that is to say whose resistance depends on the magnetic field which is applied to it. This member is connected to a source 42 of a constant current and to a device 44 for measuring the voltage which appears at its terminals. At the bottom right of the Figure is a symbolic representation of a rotary magnetic field H which is applied in the plane of the layer and which is directed in turn in four directions $d_1$, $d_2$, $d_3$ and $d_4$. This field only appears when the card is inserted in the operating station since it is the station which contains the means of generating such a field. Under other circumstances there is no rotary field applied to the layer, the only field present being the polarizing field Hz which is shown at the left of the Figure.

The operation of the means illustrated in FIG. 3 will not be described in detail here since it is widely known. On this subject reference may be made to the documents cited above. Briefly, it can be said that in the presence of the rotary field H, the magnetic bubbles are attracted in turn by the poles which appear at the electrodes on the propagation tracks. They thus travel in the various electrodes. The passage of a bubble opposite the magnetoresistive member 40 produces a change in the induction to which this member is exposed, which causes a change in its resistance and thus a change in the voltage which appears at its terminals (assuming that the current passing through it is constant). Thus, in the final analysis, the passage of a bubble past the detecting member manifests itself as a variation in the voltage which appears across the apparatus 44.

The interface coupler 4 with which the card according to the invention is provided may be of any kind and may be formed, for example, by a connector employing metal contact strips, retractable pins, or metal-plated surfaces, etc. or any other means which make electrical contact with complementary means situated in the fixed stations.

Figure 5:
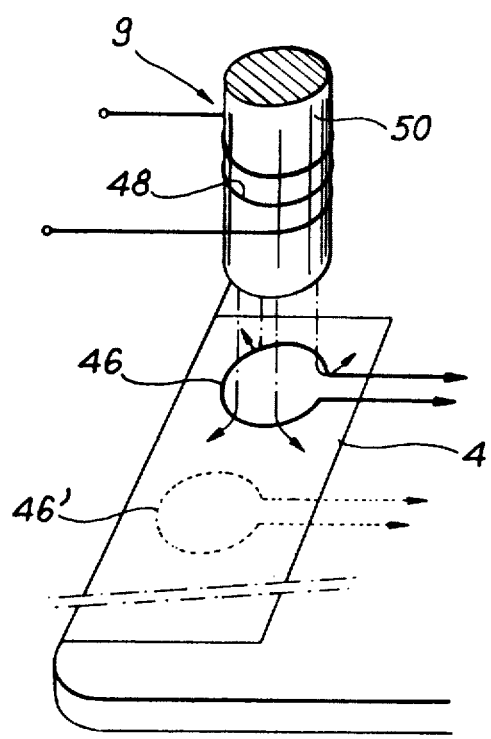
FIG. 5 shows a particular embodiment of interface coupler.

The interface coupler may also be of an inductive nature and may have windings which are in mutual induction with other windings arranged in the operating station as shown in FIG. 5.

The means which are shown in FIG. 5 comprise in the case of the coupler 4 of the card, a plurality of loops 46 (only one of which is shown). These loops are connected to the various circuits of the card. In the case of the coupler 9 of the operating station, multi-turn windings 48 are provided with a magnetic core 50 (of ferrite or mu-metal for example). The loops 46 and corresponding winding 48 are coupled by mutual induction when the card is inserted in the operating station.

In operation, when an item of data or a supply current is transmitted from the station to the card, winding 48 is fed with an alternating current of high frequency (for example in the region of 500 kHz or 1 MHz), which, by induction, gives rise in loop 46 to a current of the same frequency which is then fed to the circuits of the card, possibly after rectification. When transmission takes place in the opposite direction, it is an alternating current flowing in loop 46 which induces an alternating voltage in winding 48, the combination this time acting as a voltage step-up circuit.

If the card is likely to be subjected to varying stray magnetic fluxes, each loop 46 of the interface coupler 4 may have associated with it a compensating loop 46', which, like loop 46, is exposed to the said varying fluxes. The signals emitted by loops 46 and 46' are then substracted from one another, the difference signal being free of the effect of the stray fluxes.

Finally, rather than using a compensating loop in the interface coupler of the cards, each loop might possibly have associated with it a threshold circuit such that the threshold of the circuit is never reached as a result of stray inductions alone.

While the invention has been described in connection with specific illustrative embodiments, various modifications may suggest themselves to those skilled in the art and the appended claims, to which reference should be made, are intended to cover all such variations which fall within the true spirit of the invention.

I claim:

1. A portable card adapted to be used in a data processing system having a data processing station and means disposed at said processing station for establishing a rotating magnetic field at said processing station, said card comprising means for processing data, at least part of said means including magnetic bubble elements for interfacing with the processing station and the established rotating magnetic field generated at said processing station external of said card and coupler means separate from said processing means for interfacing with said processing station to enable the flow of data between said card and said processing station.

2. A portable card according to claim 1, wherein said magnetic bubble elements comprise a memory.

3. A portable card according to claims 1 or 2 further including a layer of magnetic material, said layer containing said magnetic bubbles, said layer having a propagation track and means for detecting the bubbles, and means for generating a magnetic polarizing field perpendicular to said layer.

4. A portable card according to claim 3, wherein the means for creating the magnetic polarizing field includes two flat permanent magnets arranged on either side of the layer.

5. A portable card according to claim 3, wherein the means for detecting the bubbles comprises a magnetoresistive member and means for detecting changes in the resistance in said member.

6. A portable card according to any of claims 1 or 2, wherein the means for processing further includes a comparator, a processing circuit, the comparator having two inputs and one output, the output of the comparator being connected to said processing circuit for giving authority to the processing circuit to come into operation.

7. A portable data card as set forth in claim 1 wherein said coupler means is disposed at one edge of said card and includes a coil adapted to be magnetically coupled to the processing station.

8. A portable data card as set forth in claim 7 wherein said coupler means further includes a compensating coil adapted to be magnetically coupled to the processing station for compensating for stray magnetic fluxes.

9. A portable data card adapted to be used in a data processing system having a data processing station and means disposed at said processing station for establishing a rotating magnetic field at said processing station adapted to be applied to said card upon presentation of said card at the data processing station, said card comprising means for processing data, at least part of said means including a magneitc bubble memory adapted to have written therein by said rotating magnetic field an identity code, said identity code upon being written into memory being inaccessible from outside the card, coupler means on said card for interfacing with said processing station to enable the flow of data between said card and said processing station upon identification of said identity code and means for processing data including a comparator connected between said coupler means and said magnetic bubble for comparing the identity code with an identity code applied to the coupler means and authorizing the flow of data when the two codes are identical.

10. A portable card as set forth in claim 9 wherein the means for processing data further includes a processor circuit having one input connected to receive an authorizing signal from said comparator and a second input connected to receive data signals applied to said comparator.

11. A portable data card as set forth in claim 9 including power connection means between said coupler and said means for processing data for supplying power to said data processing means.

* * * * *